(12) United States Patent
Noh

(10) Patent No.: US 10,497,857 B2
(45) Date of Patent: Dec. 3, 2019

(54) SEMICONDUCTOR DEVICES

(71) Applicant: Eunsun Noh, Yongin-si (KR)

(72) Inventor: Eunsun Noh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/656,007

(22) Filed: Jul. 21, 2017

(65) Prior Publication Data

US 2018/0212140 A1    Jul. 26, 2018

(30) Foreign Application Priority Data

Jan. 26, 2017    (KR) .................. 10-2017-0012426

(51) Int. Cl.
| | |
|---|---|
| *H01L 43/02* | (2006.01) |
| *H01L 43/08* | (2006.01) |
| *H01L 43/10* | (2006.01) |
| *H01L 43/12* | (2006.01) |
| *G11C 11/16* | (2006.01) |
| *H01L 27/22* | (2006.01) |

(52) U.S. Cl.
CPC ............ *H01L 43/02* (2013.01); *G11C 11/161* (2013.01); *H01L 43/08* (2013.01); *H01L 43/10* (2013.01); *H01L 43/12* (2013.01); *H01L 27/228* (2013.01)

(58) Field of Classification Search
CPC ....... H01L 43/02; H01L 27/228; H01L 43/10; G11C 2211/5612
See application file for complete search history.

(56) References Cited

U.S. PATENT DOCUMENTS

| 5,143,797 A | 9/1992 | Hashima et al. |
|---|---|---|
| 8,724,377 B2 | 5/2014 | Yamanaka et al. |

(Continued)

FOREIGN PATENT DOCUMENTS

KR    10-1489740 B1    2/2015

OTHER PUBLICATIONS

"Optimized Antireflection Coatings using Silicon Nitride on Textured Silicon Surfaces based on Measurements and Multidimensional Modeling", Shubham Duttaguota et al, Energy Procedia 15 (2012) 78-83.

*Primary Examiner* — Wael M Fahmy
*Assistant Examiner* — Sarah K Salerno
(74) *Attorney, Agent, or Firm* — Harness, Dickey & Pierce, P.L.C.

(57) ABSTRACT

A semiconductor device may include a bottom electrode contact and a magnetic tunnel junction on the bottom electrode contact. The semiconductor device may include a capping insulating layer covering side surfaces of the magnetic tunnel junction. A thickness of the capping insulating layer may be larger than a vertical height of the magnetic tunnel junction. The bottom electrode contact may be in a mold insulating layer on a substrate. The semiconductor device may include a top electrode on the magnetic tunnel junction. The bottom electrode contact may include a monometallic material. The top electrode may include a conductive metal nitride. The semiconductor device may be configured to improve the measurement sensitivity of a semiconductor inspection system with regard to perpendicular magnetization characteristics of magnetic layers included in the magnetic tunnel junction.

17 Claims, 13 Drawing Sheets

(56) References Cited

U.S. PATENT DOCUMENTS

| | | |
|---|---|---|
| 9,362,486 B2 | 6/2016 | Kim et al. |
| 9,397,287 B1 | 7/2016 | Annunziata et al. |
| 9,508,925 B2 | 11/2016 | Pi et al. |
| 9,543,357 B2 | 1/2017 | Ko |
| 2005/0023581 A1* | 2/2005 | Nuetzel .................. B82Y 10/00 |
| | | 257/295 |
| 2016/0268499 A1* | 9/2016 | You .......................... H01L 43/12 |
| 2017/0040531 A1* | 2/2017 | Chung .................... H01L 43/12 |
| 2017/0053965 A1* | 2/2017 | Baek ...................... H01L 27/228 |
| 2017/0092852 A1* | 3/2017 | Son ......................... H01L 43/12 |
| 2017/0179194 A1* | 6/2017 | Annunziata ........... H01L 27/222 |

\* cited by examiner

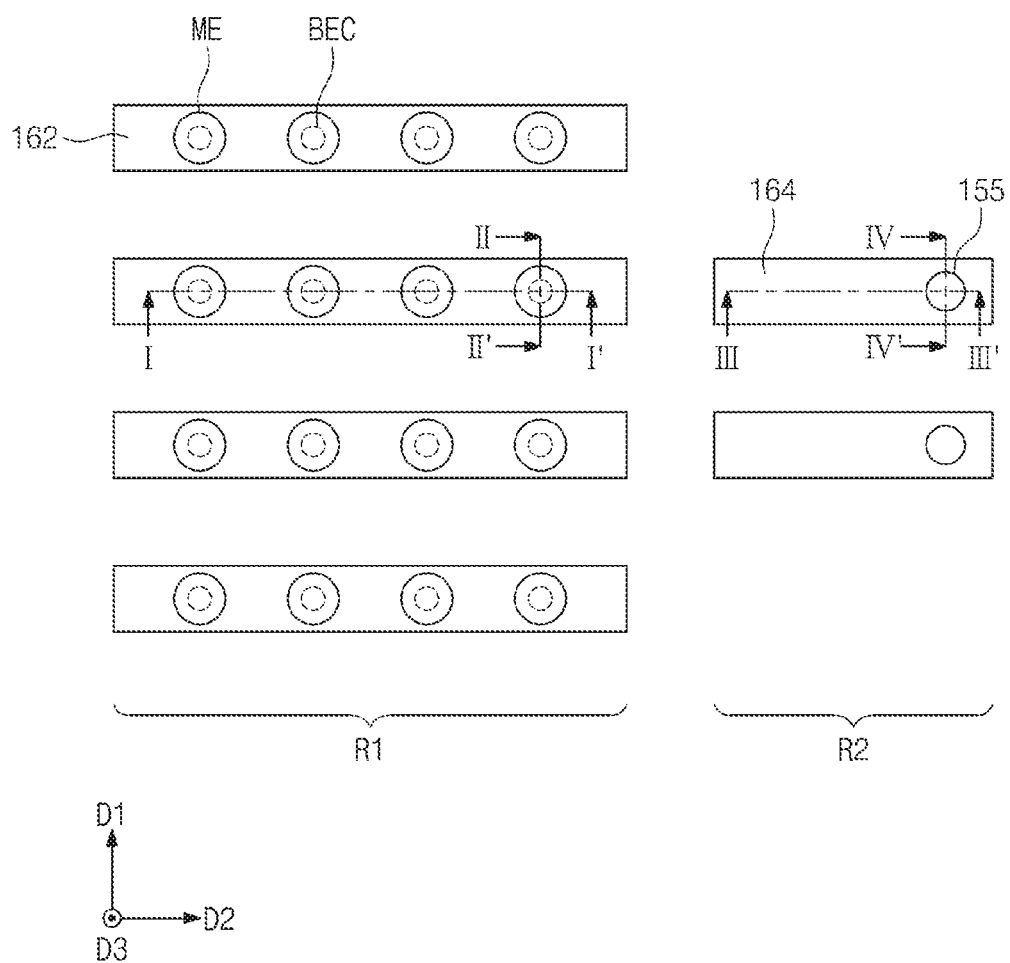

US 10,497,857 B2

SEMICONDUCTOR DEVICES

CROSS-REFERENCE TO RELATED APPLICATIONS

This U.S. non-provisional patent application claims priority under 35 U.S.C. § 119 to Korean Patent Application No. 10-2017-0012426, filed on Jan. 26, 2017, in the Korean Intellectual Property Office, the entire contents of which are hereby incorporated by reference.

BACKGROUND

The present disclosure relates to semiconductor devices, and in particular to semiconductor devices including one or more magnetic memory elements. Magnetic memory elements may be referred to interchangeably herein as magnetic memory devices.

Due to the increased demand for electronic devices configured to operate according to a relatively fast operating speed (e.g., processing speed) and/or a relatively low power consumption rate, semiconductor devices may be configured to be associated with a fast operating speed and/or a low operating voltage. Such semiconductor devices may include one or more magnetic memory devices in order to be configured to be associated with a fast operating speed and/or a low operating voltage. For example, magnetic memory devices may provide technical advantages for semiconductor devices by virtue of incorporation therein, including low latency and non-volatility associated with the semiconductor devices. As a result, magnetic memory devices are being regarded as emerging next-generation memory devices.

A magnetic memory device may include a magnetic tunnel junction (MTJ). A MTJ may include two magnetic layers and a tunnel barrier layer interposed therebetween. Resistance (e.g., "electrical resistance") of the MTJ may vary depending on magnetization directions associated with the magnetic layers. For example, the resistance of the MTJ may be higher based on magnetization directions of the magnetic layers being anti-parallel than when magnetization directions of the magnetic layers are parallel. Such a difference in resistance can be used to store data in a magnetic memory device. However, more research is underway regarding mass-producing magnetic memory devices.

SUMMARY

Some example embodiments of the inventive concepts provide a highly-stable semiconductor device that can be fabricated with high productivity.

According to some example embodiments of the inventive concepts, a device may include a mold insulating layer on a substrate, a bottom electrode contact extending at least partially through the mold insulating layer, a magnetic tunnel junction on the bottom electrode contact, and a capping insulating layer covering side surfaces of the magnetic tunnel junction. The capping insulating layer may have a thickness that is greater than a vertical height of the magnetic tunnel junction.

According to some example embodiments of the inventive concepts, a device may include a substrate, a first mold insulating layer and a second mold insulating layer, a bottom electrode contact, a magnetic tunnel junction on the bottom electrode contact, and a capping insulating layer covering side surfaces of the magnetic tunnel junction and extending to a top surface of the second mold insulating layer. The substrate may include a first region and a second region. The first mold insulating layer and the second mold insulating layer may be sequentially stacked on the first and second regions of the substrate. The first mold insulating layer may be associated with a first refractive index. The second mold insulating layer may be associated with a second refractive index. The second refractive index may be different from the first refractive index. The second mold insulating layer may include a recessed top surface. The recessed top surface may have a greater height on the first region than on the second region. The bottom electrode contact may extend vertically through an entirety of the first mold insulating layer and the second mold insulating layer on the first region.

According to some example embodiments of the inventive concepts, a device may include a bottom electrode contact, a magnetic tunnel junction on the bottom electrode contact, and a top electrode on the magnetic tunnel junction. The bottom electrode contact may include a monometallic material. The top electrode may include a conductive metal nitride.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 9 is a plan view illustrating a semiconductor device and a method of fabricating the same, according to some example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which some example embodiments are shown.

Figure 1:
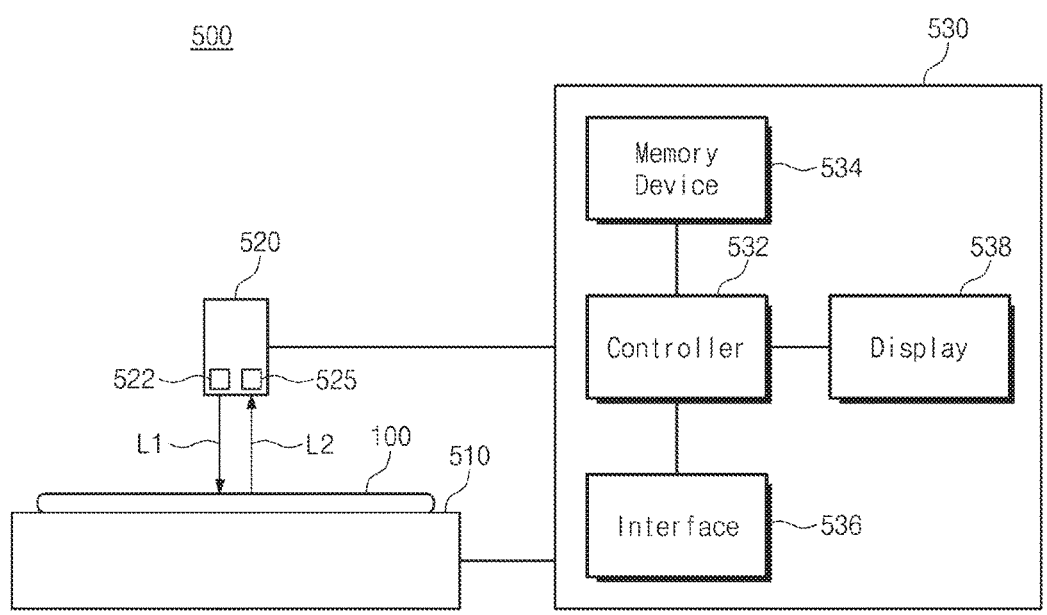
FIG. 1 is a schematic diagram illustrating a semiconductor inspection system configured to inspect a semiconductor device, according to some example embodiments of the inventive concepts.
Figure 2:
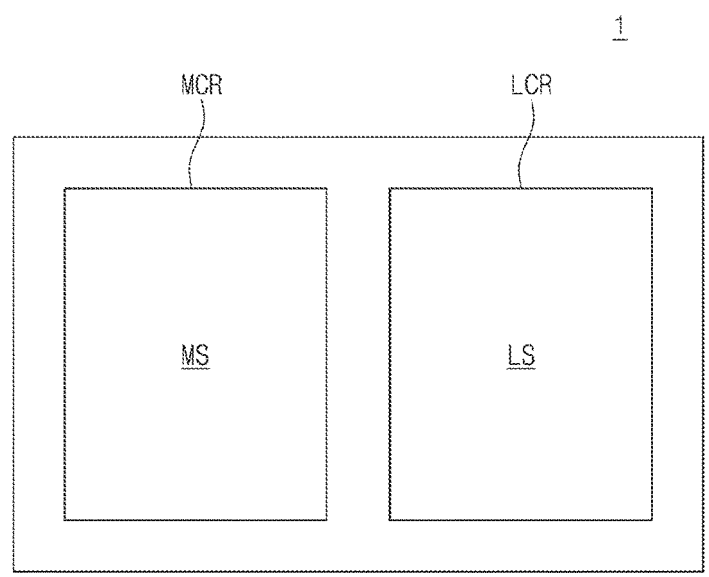
FIG. 2 is a schematic block diagram illustrating a semiconductor device according to some example embodiments of the inventive concepts.
Figure 3:
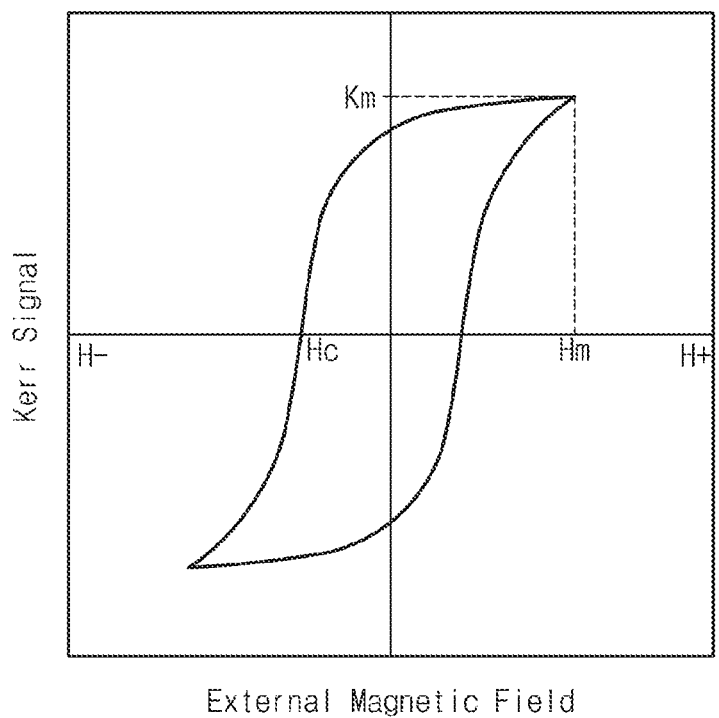
FIG. 3 shows a magnetic hysteresis loop of a semiconductor device obtained using the semiconductor inspection system of FIG. 1.

FIG. 1 is a schematic diagram illustrating a semiconductor inspection system configured to inspect a semiconductor device, according to some example embodiments of the inventive concepts. FIG. 2 is a schematic block diagram illustrating a semiconductor device according to some example embodiments of the inventive concepts. FIG. 3 shows a magnetic hysteresis loop of a semiconductor device obtained using the semiconductor inspection system of FIG. 1.

Referring to FIGS. 1 and 2, a semiconductor inspection system 500 may include a stage 510, on which a substrate 100 is loaded, an inspection head 520, which is provided over the stage 510, and an electronic system 530, which is configured to control the inspection head 520.

The substrate 100 may be a wafer with a plurality of chip regions. A semiconductor device 1 may be formed within each of the chip regions. As shown in FIG. 2, the semiconductor device 1 may include a memory cell region MCR, on which a memory structure MS is provided ("located"), and a logic cell region LCR, on which a logic structure LS is provided. In some example embodiments, the memory cell region MCR may have an area that is less than that of the logic cell region LCR.

The memory structure MS may include a memory cell array. For example, the memory cell array may include a plurality of memory cells, which are two- or three-dimensionally arranged on the substrate, and a plurality of word, bit, and source lines, which are electrically connected to the plurality of memory cells. Each of the memory cells may include a memory element and a selection element. In some example embodiments, the memory element may be a variable resistance device, whose electric resistance can be switched into one of two different values using an electric pulse applied thereto. For example, the memory element may be or include a magnetic tunnel junction including magnetic layers and a non-magnetic layer interposed therebetween. In some example embodiments, each of the magnetic layers may include a perpendicular magnetic structure and/or a perpendicular magnetic material, whose magnetization direction is substantially perpendicular to a top surface of the substrate 100. The selection element may be configured to selectively control an electric current passing through the memory element. For example, the selection element may be or include a PMOS or NMOS field effect transistor.

The logic structure LS may include logic circuits, which are used to perform a logical operation, and/or memory peripheral circuits, which are used to operate memory cells. The logic circuits may include logic cells, each of which is used to execute a Boolean logic function (e.g., INVERTER, AND, OR, NAND, or NOR) or a storage function (e.g., FLIP-FLOP). The memory peripheral circuits may include a row decoder, a column selection circuit, a read/write circuit, and/or a control logic, which are used for an operation of the memory cell (e.g., a read or write operation). For example, the logic structure LS may include a plurality of CMOS transistors, which constitute the logic circuits or the memory peripheral circuits, and an interconnection structure connected thereto.

The inspection head 520 may include a light emitter 522 and a light detector 525. The light emitter 522 may be configured to irradiate the substrate 100 with a laser beam L1. For example, the light emitter 522 may be configured to emit the laser beam L1 onto the memory cell region MCR of the substrate 100. The light detector 525 may be configured to detect a laser beam L2, which is incident into and reflected from the memory cell region MCR. For example, the semiconductor inspection system 500 may be a perpendicular MOKE optical device, which is configured to measure perpendicular magnetization characteristics of a magnetic layer using a magneto-optical Kerr effect (MOKE). The MOKE describes an effect causing a change in polarization of light reflected from a magnetic material and the perpendicular MOKE optical device may be configured to analyze polarization of light to be reflected from magnetic layers and to obtain information regarding perpendicularity in magnetization of the object. As an example, the semiconductor inspection system 500 may be a Polar Kerr System for MRAM (MicroSense, LLC). The inspection head 520 may be controlled by the electronic system 530. For example, the electronic system 530 may be configured to control the operations of the light emitter 522 and light detector 525 and the motion of the inspection head 520 and to analyze data to be obtained from the inspection head 520.

The electronic system 530 may include a controller 532, a memory device 534, an interface 536, and a display device 538. The controller 532, which may also be referred to interchangeably herein as a "processor," "processing circuitry," or the like, may control a laser beam emitting operation of the light emitter 522. The controller 532 may also control a light detection operation of the light detector 525. To implement control of one or more elements, the controller 532 may execute a program of operations stored on the memory device 534. In addition, the controller 532 may be configured to process data, which are obtained by the inspection head 520, in the various forms (e.g., numerical values, graphs, images, and so forth). The controller 532 may also be configured to store data, which are obtained by the inspection head 520 and/or are processed by the controller 532, into the memory device 534. In some example embodiments, other data (e.g., commands for executing control functions of the controller 532) may be further stored in the memory device 534. The interface 536 may include at least one of various input devices (e.g., keyboards, keypads, and/or stick-type input devices). The display device 538 may be configured to display data, which are stored in the memory device 534 and/or are processed by the controller 532. The display device 538 may be configured to display such data in the various forms (e.g., numerical values, graphs, images, and so forth).

The semiconductor inspection system 500 may be used to obtain magnetic hysteresis loops for magnetic layers in the semiconductor device 1. The magnetic hysteresis loop may be a curve showing a magnetization behavior of a ferromagnetic material induced by a change of an external magnetic field. In the case where a perpendicular magnetic field, which is applied to a target material with perpendicular magnetic anisotropy (i.e., perpendicular magnetization property), is changed in a sinusoidal manner, it may be possible to obtain a magnetic hysteresis loop as shown in FIG. 3. The obtained magnetic hysteresis loop, which contains information on perpendicular magnetization characteristics of magnetic layers (e.g., on an intensity of Kerr signal (Km) at a saturated magnetization state or at an external magnetic field (Hm) or a coercive force (Hc)), may be used to determine process parameters in an in-FAB process monitoring operation on the magnetic layers. In FIG. 3, the Kerr signal may be dependent on optical characteristics of an inspection device or a target object or on a magnetic flux density. For example, an intensity of the Kerr signal may be strongly dependent on optical characteristics of the inspection device or the target object, although it is somewhat proportional to the magnetic flux density.

In general, magnetic layers may be patterned to form a plurality of two- or three-dimensionally arranged memory cells. In the case where the semiconductor inspection system 500 is used to measure perpendicular magnetization characteristics of patterned magnetic layers (i.e., magnetic tunnel junctions), it may be advantageous for the magnetic tunnel junctions to have a high pattern density. However, to meet limitations in a fabrication process and/or provide products having particular electrical or operational characteristics, a pattern density of the magnetic tunnel junctions may be limited. Due to such limitations of the pattern density of the magnetic tunnel junctions, it may be difficult to obtain reliable data on perpendicular magnetization characteristics of the magnetic tunnel junctions. For example, in the case where the highest intensity of the Kerr signal (Km) is smaller than a specific value, it may be difficult to obtain a magnetic hysteresis loop with reliability, owing to measurement noise. To obtain reliable data (e.g., the highest intensity of the Kerr signal (Km)) using the semiconductor inspection system 500, measurement sensitivity of the semiconductor inspection system 500 may be increased, or the memory structure MS on the memory cell region MCR may be configured to be advantageous for measurement using the semiconductor inspection system 500. A semiconductor device according to some example embodiments of the inventive concepts may be configured to include the memory structure MS, which is fabricated using the latter method. As a result, according to some example embodiments of the inventive concepts, it may be possible to perform an in-fab monitoring operation on the perpendicular magnetization characteristics of the magnetic tunnel junctions and to improve productivity in the process of fabricating a semiconductor device, in which the magnetic layers with the perpendicular magnetization characteristics are included, and stability in quality of the semiconductor device. A memory structure according to some example embodiments of the inventive concepts and a semiconductor device therewith will be described in more detail below.

Figure 4:
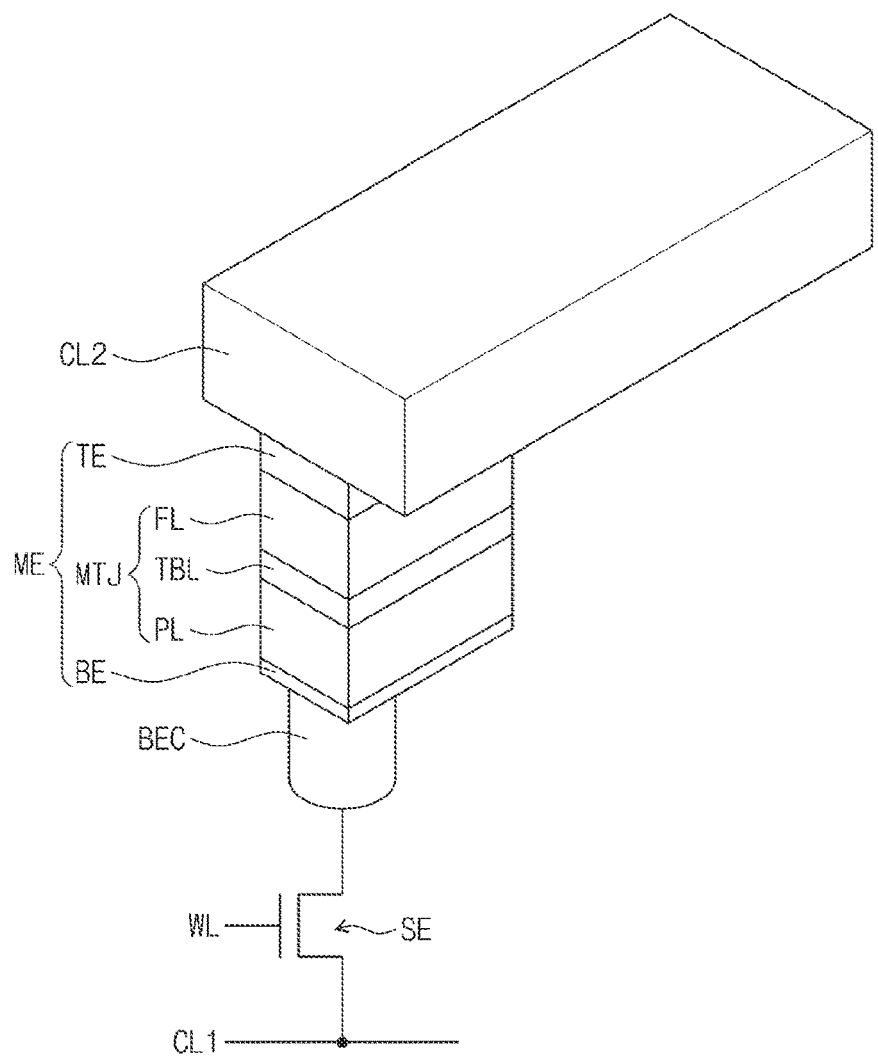
FIG. 4 is a diagram illustrating an example of a memory cell, which is included in a semiconductor device according to some example embodiments of the inventive concepts.

FIG. 4 is a diagram illustrating an example of a memory cell, which is included in a semiconductor device according to some example embodiments of the inventive concepts.

Referring to FIG. 4, a memory cell may include a memory element ME and a selection transistor SE. The memory element ME may have a layered structure, whose electric resistance can by changed by a spin transfer process using an electric current passing therethrough. For example, the memory element ME may have a layered structure configured to exhibit a magneto-resistance property and may include at least one ferromagnetic material and/or at least one antiferromagnetic material. For example, the memory element ME may be or include a magnetic tunnel junction MTJ.

In some example embodiments, the magnetic tunnel junction MTJ may include a pinned layer PL, a free layer FL, and a tunnel barrier layer TBL interposed therebetween. The pinned layer PL may have a fixed magnetization direction, and the free layer FL may have a magnetization direction that can be changed to be parallel or antiparallel to that of the pinned layer PL. The magnetic tunnel junction MTJ may have electric resistance that is dependent on relative magnetization directions of the pinned and free layers PL and FL. In the case where the pinned and free layers PL and FL of the magnetic tunnel junction MTJ have magnetization directions parallel to each other, the magnetic tunnel junction MTJ may have a low resistance state or a state of data '0' corresponding to a first data. In the case where the pinned and free layers PL and FL of the magnetic tunnel junction MTJ have magnetization directions antiparallel to each other, the magnetic tunnel junction MTJ may have a high resistance state or a state of data '1' corresponding to a second data.

A gate electrode of the selection transistor SE may be connected to a corresponding one of the word lines WL, a first terminal of the selection transistor SE may be connected to a first conductive line CL1, and a second terminal of the selection transistor SE may be connected to a corresponding one of second conductive lines CL2 through the magnetic tunnel junction MTJ. For example, the first conductive line CL1 may be used as a source line that is connected to a source electrode of the selection transistor SE, and the second conductive line CL2 may be used as a bit line that is connected to a drain electrode of the selection transistor SE. In some example embodiments, the first and second conductive lines CL1 and CL2 may be used as the bit and source lines, respectively. The second terminal of the selection transistor SE may be electrically connected to the magnetic tunnel junction MTJ via a bottom electrode contact BEC.

In some example embodiments, the memory element ME may further include a bottom electrode BE and a top electrode TE, and the magnetic tunnel junction MTJ may be provided between the bottom electrode BE and the top electrode TE. In other words, the bottom electrode BE may be provided between the bottom electrode contact BEC and the magnetic tunnel junction MTJ, and the top electrode TE may be provided between the magnetic tunnel junction MTJ and the second conductive line CL2. Hereinafter, the magnetic tunnel junction MTJ will be described in more detail with reference to FIG. 5.

Figure 5:
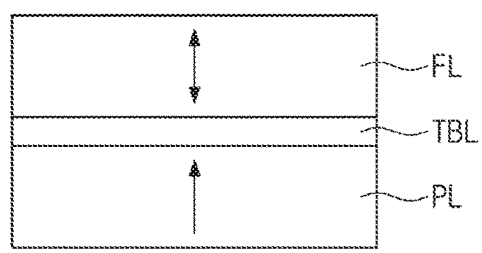
FIG. 5 is the schematic diagram illustrating a magnetic tunnel junction according to some example embodiments of the inventive concepts.

FIG. 5 is the schematic diagram illustrating a magnetic tunnel junction according to some example embodiments of the inventive concepts.

Referring to FIG. 5, the pinned and free layers PL and FL may be configured to have a perpendicular magnetization structure; for example, at least one or each of them may have a magnetization direction that is substantially normal to the top surface of the tunnel barrier layer TBL. In some example embodiments, at least one or each of the pinned and free layers PL and FL may include at least one of materials with an $L1_0$ crystal structure, materials having the hexagonal closed packed (HCP) structure, or amorphous rare-earth transition metal (RE-TM) alloys. As an example, each of the pinned and free layers PL and FL may include at least one of $L1_0$ materials, such as $Fe_{50}Pt_{50}$, $Fe_{50}Pd_{50}$, $Co_{50}Pt_{50}$, $Co_{50}Pd_{50}$, and $Fe_{50}Ni_{50}$. In some example embodiments, each of the pinned and free layers PL and FL may include at least one of HCP cobalt-platinum (CoPt) disordered alloys containing 10-45 at. % platinum or HCP Co3Pt ordered alloys or. In some example embodiments, each of the pinned and free layers PL and FL may include at least one of the amorphous RE-TM alloys containing at least one of iron (Fe), cobalt (Co), or nickel (Ni) and at least one of rare-earth metals, such as terbium (Tb), dysprosium (Dy), and gadolinium (Gd).

In some example embodiments, at least one of the pinned and free layers PL and FL may include a material having an interface perpendicular magnetic anisotropy. The interface perpendicular magnetic anisotropy may refer to a perpendicular magnetization phenomenon, which is seen at an interface of a magnetic layer with an intrinsically in-plane magnetization property, when the magnetic layer is placed to be adjacent to or in contact with another layer. Here, the term "intrinsic in-plane magnetization property" will be used to mean that a magnetization direction of a magnetic layer is oriented parallel to a longitudinal direction thereof, when there is no external magnetic field applied thereto. For example, in the case that a magnetic layer with the intrinsic in-plane magnetization property is formed on a substrate and there is no external magnetic field applied thereto, a magnetization direction of the magnetic layer may be oriented substantially parallel to the top surface of the substrate. As an example, each of the pinned and free layers PL and FL may include at least one of cobalt (Co), iron (Fe), or nickel (Ni). In addition, each of the pinned and free layers PL and FL may further include at least one of non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and nitrogen (N). As an example, each of the pinned and free layers PL and FL may include a layer of CoFe or NiFe, in which boron (B) is added. Furthermore, at least one of the pinned and free layers PL and FL may further include at least one of titanium (Ti), aluminum (Al), magnesium (Mg), tantalum (Ta), or silicon (Si) to lower saturation magnetization thereof.

The tunnel barrier layer TBL may include at least one of magnesium oxide, titanium oxide, aluminum oxide, magnesium-zinc oxide, magnesium-boron oxide, titanium nitride, or vanadium nitride. As an example, the tunnel barrier layer TBL may be a single layer of magnesium oxide (MgO). As another example, the tunnel barrier layer TBL may include a plurality of layers.

Electric resistance of the magnetic tunnel junction MTJ may be dependent on relative magnetization directions of the pinned and free layers PL and FL. For example, the electric resistance of the magnetic tunnel junction MTJ may be much greater when magnetization directions of the pinned and free layers PL and FL are antiparallel to each other than when they are parallel to each other. As a result, the electric resistance of the magnetic tunnel junction MTJ can be controlled by changing a magnetization direction of the free layer FL, and this may be used as data storing mechanism for the magnetic memory device according to some example embodiments of the inventive concepts.

Figure 6:
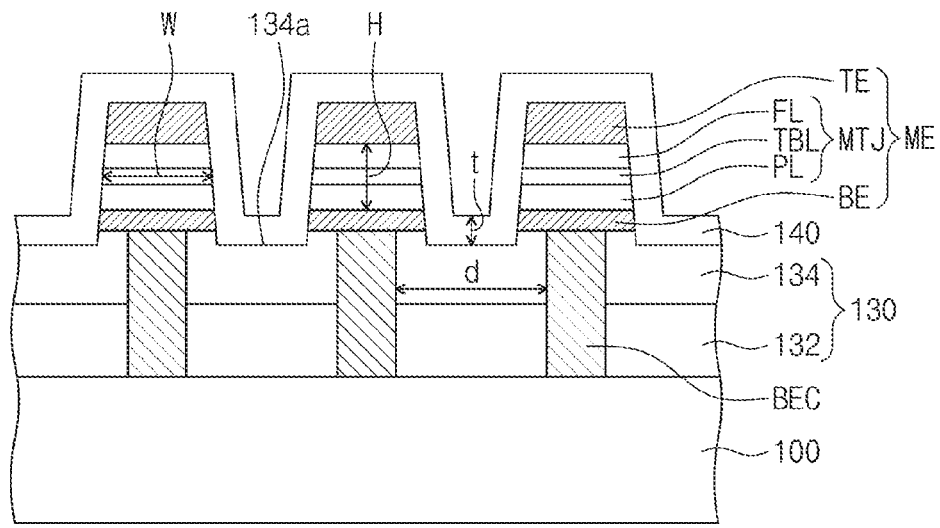
FIG. 6 is a sectional view illustrating a portion of the memory structure of FIG. 2.
Figure 7:
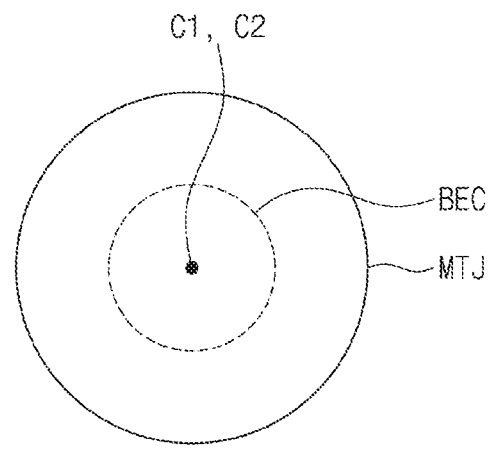
FIG. 7 is a plan view illustrating an example arrangement of a magnetic tunnel junction with respect to a bottom electrode contact.

FIG. 6 is a sectional view illustrating a portion of the memory structure of FIG. 2. FIG. 7 is a plan view illustrating an example arrangement of a magnetic tunnel junction with respect to a bottom electrode contact.

Referring to FIG. 6, the substrate 100 may be provided. The substrate 100 may be, for example, a silicon substrate, a germanium substrate, or a silicon-germanium substrate. The substrate 100 may include a conductive region (not shown), which is used as a part of the selection transistor SE of FIG. 4.

A mold insulating layer 130 may be placed ("located") on the substrate 100. The mold insulating layer 130 may have a multi-layered structure. In some example embodiments, the mold insulating layer 130 may include a first mold insulating layer 132 and a second mold insulating layer 134, which are sequentially stacked on the substrate 100. Restated, the first mold insulating layer 132 and the second mold insulating layer 134 may be sequentially stacked, in relation to each other, on the bottom electrode contact BEC. As shown, the bottom electrode contact BEC may extend through an entirety of the first mold insulating layer 132 and the second mold insulating layer 134. The first mold insulating layer 132 and the second mold insulating layer 134 may have different refractive indices from each other. Restated, the first mold insulating layer 132 may be associated with a first refractive index, and the second mold insulating layer 134 may be associated with a second refractive index, the second refractive index being different from the first refractive index. For example, the refractive index of the second mold insulating layer 134 may be higher ("greater") than that of the first mold insulating layer 132. Restated, the second mold insulating layer 134 may include a mold insulating layer material that is associated with a mold insulating layer refractive index that is greater than the first refractive index. As an example, the first mold insulating layer 132 may be formed of or include (e.g., at least partially comprise) silicon oxide, and the second mold insulating layer 134 may be formed of or include single-crystalline silicon, silicon nitride, or silicon oxynitride. A top surface of the second mold insulating layer 134 may include a recessed top surface 134a that is not overlapped with the memory elements ME and is recessed toward the substrate 100. Unlike that illustrated in the drawings, the recessed top surface 134a may have a concave shape in a direction toward the substrate 100.

Although not shown, a lower interlayered insulating layer (not shown) may be provided between the substrate 100 and the mold insulating layer 130. The lower interlayered insulating layer may be formed of or include at least one of silicon oxide, silicon nitride, silicon oxynitride, or low-k materials. The lower interlayered insulating layer may have a single- or multi-layered structure. A lower interconnection structure (not shown), which is electrically connected to the conductive region of the substrate 100, may be provided in the lower interlayered insulating layer.

Bottom electrode contacts BEC may be provided in the mold insulating layer 130. Restated, the bottom electrode contact BEC may extend at least partially through the mold insulating layer 130. The bottom electrode contacts BEC may be provided to vertically pass through the first and second mold insulating layers 132 and 134. The bottom electrode contacts BEC may be spaced apart from each other by a specific distance d that is selected to meet process limitations in its fabrication and/or provide products having particular electrical characteristics. The distance d between the bottom electrode contacts BEC may affect a pattern density of the memory elements ME. For example, the larger the distance d, the lower the pattern density of the memory elements ME. Each of the bottom electrode contacts BEC may include at least one of metals (e.g., tungsten, aluminum, titanium, and/or tantalum), conductive metal nitrides (e.g., titanium nitride, tantalum nitride, and/or tungsten nitride), or metal-semiconductor compounds (e.g., metal silicide). In some example embodiments, the bottom electrode contact BEC may be formed of or include a monometallic material (e.g., tungsten).

The memory elements ME may be provided on the bottom electrode contacts BEC, respectively. Each of the memory elements ME may have an island shape and may be placed to be overlapped with the bottom electrode contact BEC thereunder. As shown in FIG. 7, each of the memory elements ME may be provided on the bottom electrode contact BEC in such a way that a center axis C1 thereof is concentric to a center axis C2 of the bottom electrode contact BEC. As further shown in FIG. 7, the center axis C1 of the memory element ME may be the center axis C1 of the magnetic tunnel junction MTJ of the memory element ME. The memory element ME may be electrically connected to the conductive region of the substrate 100 via the bottom electrode contact BEC and a lower interconnection line (not shown).

Each of the memory elements ME may include the bottom electrode BE, the magnetic tunnel junction MTJ, and the top electrode TE. The bottom electrode BE may be formed of or include at least one of conductive metal nitrides (e.g., titanium nitride or tantalum nitride) or rare-earth metals (e.g., ruthenium or platinum). The top electrode TE may be formed of or include at least one of metals (e.g., tungsten, titanium, tantalum, or aluminum) or conductive metal nitrides (e.g., titanium nitride or tantalum nitride). For example, the top electrode TE may include a conductive metal nitride (e.g., titanium nitride or tantalum nitride) having lower reflectance than metals. The structure and materials of the magnetic tunnel junction MTJ have been described with reference to FIGS. 4 and 5, and thus, a detailed description thereof will be omitted.

A width W and a vertical height H of the magnetic tunnel junction MTJ may be selected to meet process limitations in its fabrication and/or products having particular electrical characteristics. Here, the width W of the magnetic tunnel junction MTJ may refer to the largest width of the tunnel barrier layer TBL interposed between the magnetic layers PL and FL, and the vertical height H may refer to a vertical distance from the bottom surface of the pinned layer PL to the top surface of the free layer FL. In common with the distance d between adjacent ones of the magnetic tunnel junctions MTJ, the width W of the magnetic tunnel junction MTJ may affect a pattern density of the memory elements ME.

A capping insulating layer 140 may be provided on the memory elements ME. The capping insulating layer 140 may be provided to conformally cover top and side surfaces of the memory elements ME, and moreover, it may be further extended to cover the recessed top surface 134a of the second mold insulating layer 134. The capping insulating layer 140 may be formed of or include a material having a refractive index higher than the first mold insulating layer 132. Restated, the capping insulating layer 140 may include a capping insulating layer material that is associated with a mold insulating layer refractive index that is greater than the first refractive index. For example, the capping insulating layer 140 may be formed of or include silicon nitride. Although the vertical height H of the magnetic tunnel junction MTJ is exaggeratedly illustrated, a thickness t of the capping insulating layer 140 may be greater than the vertical height H of the magnetic tunnel junction MTJ. For example, the vertical height H of the magnetic tunnel junction MTJ may be a value that ranges from about 150 Å to about 250 Å, and the thickness t of the capping insulating layer 140 may be a value that ranges from about 500 Å to about 1000 Å. Here, the thickness t of the capping insulating layer 140 may be a vertical thickness that is measured from the recessed top surface 134a of the second mold insulating layer 134.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure.

Although not shown, upper conductive lines (not shown) may be provided on top surfaces of the memory elements ME. For example, each of the upper conductive lines may penetrate the capping insulating layer 140 and be electrically connected in common to the top electrodes TE of the memory elements ME, which are arranged in a direction. The upper conductive lines may correspond to the second conductive line CL2 of FIG. 4. The memory element ME, the selection transistor SE, the mold insulating layer 130, the bottom electrode contact BEC, the capping insulating layer 140, and the first and second conductive lines CL1 and CL2, which are described with reference to FIGS. 4 to 7, may be used to constitute the memory structure MS of FIG. 2.

According to some example embodiments of the inventive concepts, the memory structure MS may be configured to improve the measurement sensitivity of the semiconductor inspection system 500 which is used to measure perpendicular magnetization characteristics of the magnetic layers PL and FL. For example, elements, which are positioned on the magnetic layers PL and FL, may be configured to increase effective transmittance of the memory structure MS to light (e.g., a laser beam). For example, the top electrode TE may be formed of a conductive metal nitride (e.g., titanium nitride or tantalum nitride), whose reflectance is lower than that of a metal (e.g., tungsten), and this may make it possible to reduce an amount of laser beam reflected from the top electrode TE (that is, to increase amount of transmission light). In addition, the capping insulating layer 140 may include silicon nitride having a high refractive index and may have a thickness larger than a height of the magnetic tunnel junction MTJ. This may make it possible to increase a light amount of laser beam to be incident into the magnetic tunnel junction MTJ through the top electrode TE and the capping insulating layer 140 and consequently to increase a light amount of laser beam (hereinafter, a first reflection laser beam) which is reflected from the magnetic layers PL and FL in the magnetic tunnel junction MTJ. As a result, the measurement sensitivity of the semiconductor inspection system 500 with regard to at least a semiconductor device that includes the memory structure MS can be improved.

In addition, elements, which are provided below the magnetic layers PL and FL, may be configured to increase effective reflectance of the memory structure MS to light (e.g., laser beam). For example, the bottom electrode contact BEC may be formed of a monometallic material (e.g., tungsten), whose reflectance is higher than that of a conductive metal nitride, and the bottom electrode contact BEC and the magnetic tunnel junction MTJ may be arranged in such a way that their center axes C1 and C2 (e.g., of FIG. 7) are aligned to each other in a direction normal to the top surface of the substrate 100, and thus, the memory structure MS may have an increased reflectance. Restated, a center axis of the bottom electrode contact BEC may be aligned with a center axis of the magnetic tunnel junction MTJ in a direction that is normal to a top surface of the substrate 100. Furthermore, since the mold insulating layer 130 is a multi-layered structure (e.g., including the first and second mold insulating layers 132 and 134) with different refractive indices, the mold insulating layer 130 may have a relatively increased reflectance. Accordingly, a reflection amount of a laser beam, which passes through the magnetic layers PL and FL and is incident into the bottom electrode contact BEC and the mold insulating layer 130, may be increased; that is, an absorption amount may be reduced. Such reflection laser beam (hereinafter, a second reflection laser beam), in conjunction with the first reflection laser beam, may be used to improve the measurement sensitivity of the semiconductor inspection system 500. Hereinafter, improvement in measurement sensitivity of the semiconductor inspection system 500, with regard to at least a semiconductor device including the memory structure as described herein, according to the afore-described conditions will be described with reference to magnetic hysteresis loops obtained by the semiconductor inspection system 500.

Figure 8A:
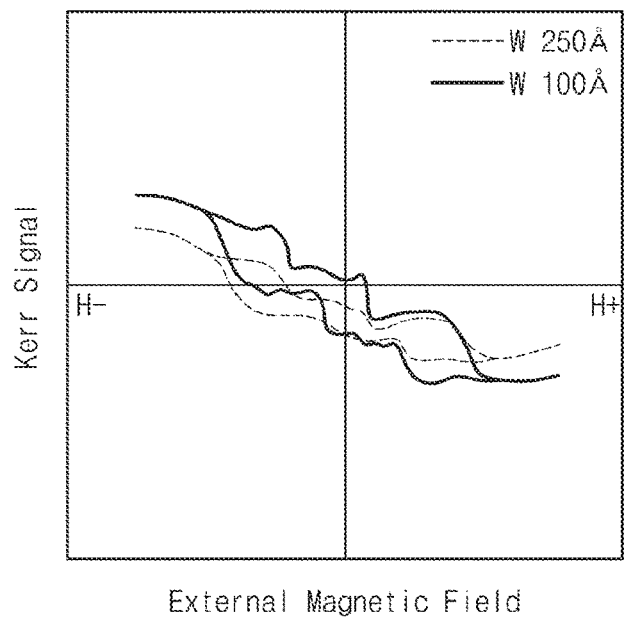
FIG. 8A shows a change in a magnetic hysteresis loop caused by a change in thickness of a top electrode, when the top electrode was made of tungsten.

FIG. 8A shows a change in a magnetic hysteresis loop caused by a change in thickness of a top electrode, when the top electrode was made of tungsten. In the present comparative experiment, magnetic layers were formed under the same condition.

As shown in FIG. 8A, the largest intensity of the Kerr signal was larger when the top electrode of tungsten had a small thickness (100 Å) than when it had a large thickness (250 Å). This result shows that by reducing reflectance of the top electrode TE (consequently, an amount of transmission light is increased), it is possible to improve measurement sensitivity of the semiconductor inspection system 500.

Figure 8B:
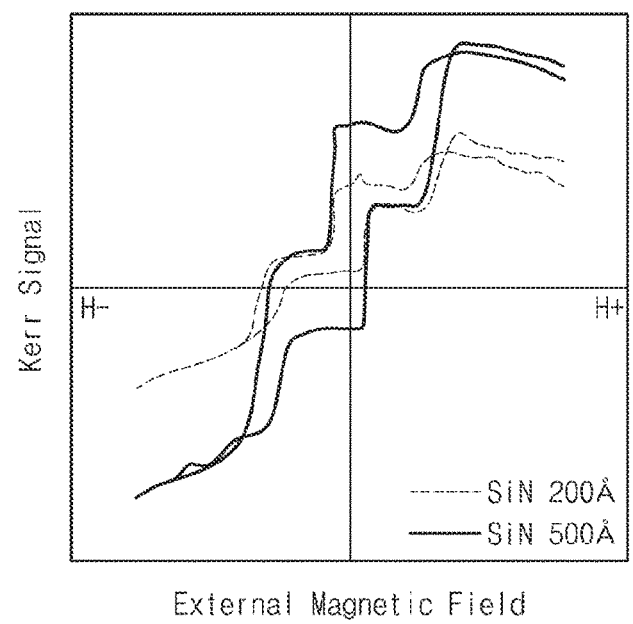
FIG. 8B shows a change in a magnetic hysteresis loop caused by a change in thickness of a capping insulating layer, when the capping insulating layer was made of silicon nitride.

FIG. 8B shows a change in a magnetic hysteresis loop caused by a change in thickness of a capping insulating layer, when the capping insulating layer was made of silicon nitride. In the present comparative experiment, magnetic layers were formed under the same condition.

As shown in FIG. 8B, the largest intensity of the Kerr signal was larger when the capping insulating layer of SiN had a large thickness (500 Å) than when it had a small thickness (200 Å). This result shows than by increasing the refractive index and thickness of the capping insulating layer, it is possible to improve the measurement sensitivity of the semiconductor inspection system 500. Although not shown, even if the capping insulating layer has a very large thickness (e.g., greater than 1000 Å), the largest intensity of the Kerr signal is too low to obtain a magnetic hysteresis loop with reliability.

Figure 8C:
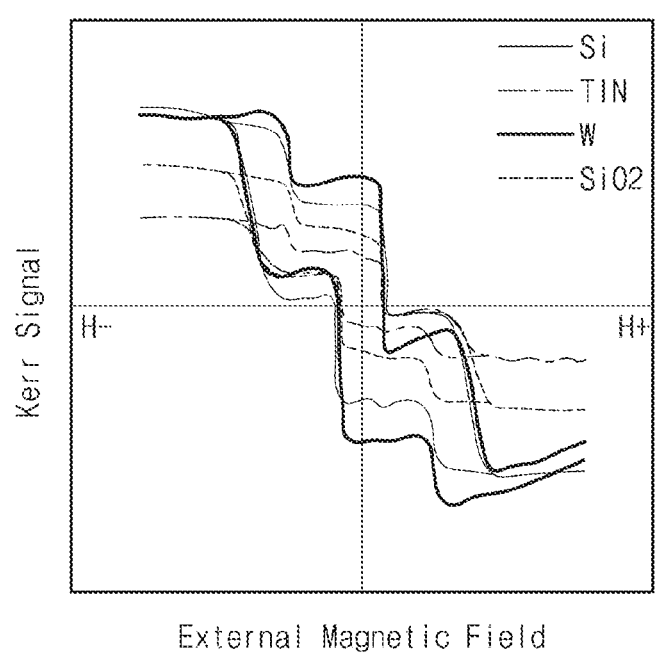
FIG. 8C shows a change in a magnetic hysteresis loop caused by a change in material of a lower layer provided below a magnetic tunnel junction.

FIG. 8C shows a change in a magnetic hysteresis loop caused by a change in material of a lower layer provided below a magnetic tunnel junction. In the present comparative experiment, magnetic layers were formed under the same condition.

As shown in FIG. 8C, the largest intensity of the Kerr signal was larger when in the case where the lower layer was formed of a monometallic material (e.g., tungsten (W)) than when it was formed of a conductive metal nitride (e.g., titanium nitride (TiN)). This result shows that when the lower contact electrode is formed of a monometallic material with relatively high reflectance, it is possible to improve the measurement sensitivity of the semiconductor inspection system 500. Furthermore, the largest intensity of the Kerr signal was larger when the lower layer was formed of silicon (Si) than when it was formed of silicon oxide ($SiO_2$). Thus, by increasing reflectance of a mold insulating layer (for example, by forming the mold insulating layer in the multi-layered structure with different refractive indices), it is possible to improve the measurement sensitivity of the semiconductor inspection system 500.

FIG. 9 is a plan view illustrating a semiconductor device and a method of fabricating the same, according to some example embodiments of the inventive concepts. FIG. 10, FIG. 11, FIG. 12, FIG. 13, FIG. 14, and FIG. 15 are sectional views, each of which shows vertical sections taken along lines I-I', II-II', III-III', and IV-IV' of FIG. 9. In order to reduce complexity in the drawings and to provide better understanding of example embodiments of the inventive concepts, some elements may be omitted. For concise description, a previously described element may be identified by a similar or identical reference number without repeating an overlapping description thereof.

Figure 10:
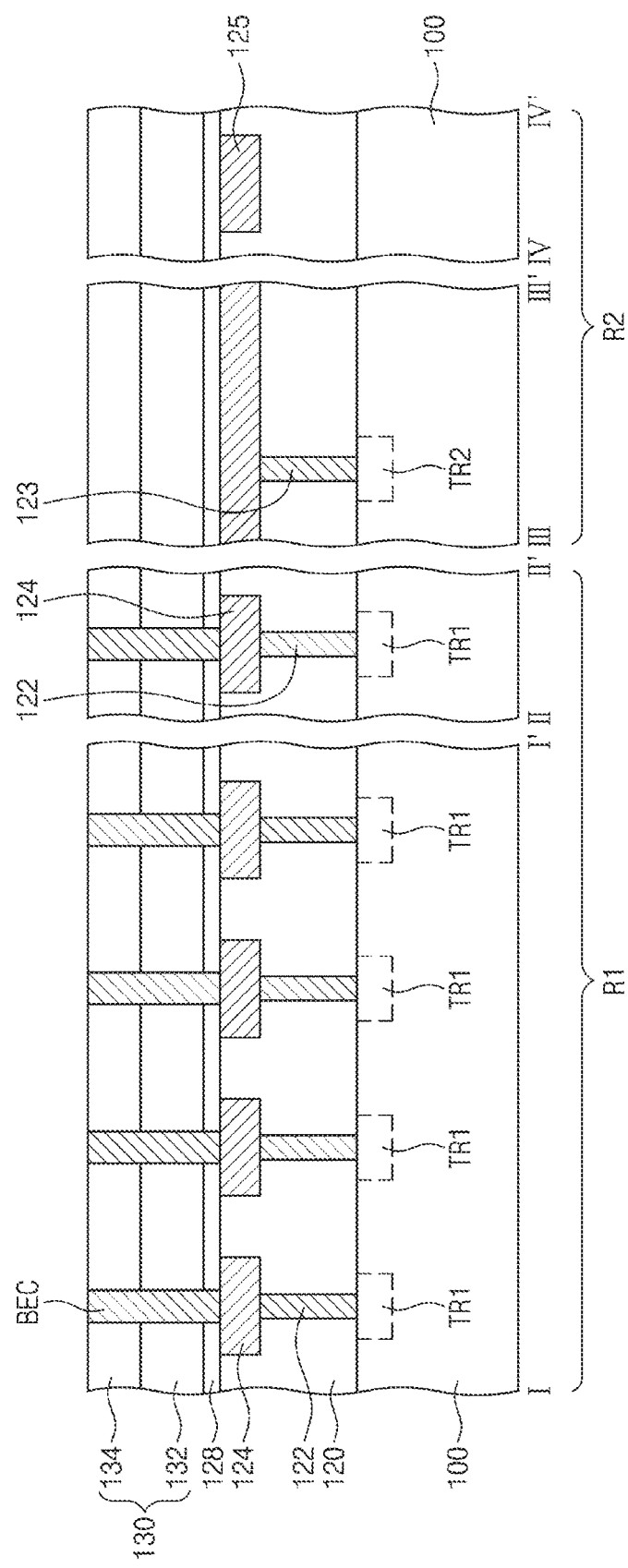
FIG. 10, FIG. 11, FIG. 12, FIG. 13, FIG. 14, and FIG. 15 are sectional views, each of which shows vertical sections taken along lines I-I', II-II', III-III', and IV-IV' of FIG. 9.

Referring to FIGS. 9 and 10, the substrate 100 including a first region R1 and a second region R2 may be provided. The first region R1 may be a portion of the memory cell region MCR of FIG. 1, and the second region R2 may be a portion of the logic cell region LCR of FIG. 1. In other words, the memory structure MS may be formed on the first region R1, and the logic structure LS may be formed on the second region R2. For example, selection transistors TR1 constituting memory cells may be formed on the first region R1 of the substrate 100, and logic transistors TR2 constituting a logic circuit or a peripheral circuit may be formed on the second region R2 of the substrate 100.

A lower interlayered insulating layer 120 may be formed on the first and second regions R1 and R2 of the substrate 100. The lower interlayered insulating layer 120 may be formed to have a single- or multi-layered structure. For example, the lower interlayered insulating layer 120 may be formed of or include at least one of silicon oxide, silicon nitride, silicon oxynitride, or low-k materials. A first lower interconnection structure may be formed in the lower interlayered insulating layer 120 and on the first region R1. For example, the first lower interconnection structure may include cell contact plugs 122 and lower conductive patterns 124. The lower conductive patterns 124 may be arranged in first and second directions D1 and D2, and each of them may have an island shape. Each of the lower conductive patterns 124 may be electrically connected to the selection transistors TR1 via the cell contact plug 122 thereunder. Although not shown, lower conductive lines (not shown), which correspond to the first conductive line CL1 described with reference to FIG. 4, may be formed in the lower interlayered insulating layer 120 and on the first region R1. The cell contact plugs 122 may be formed of or include at least one of doped semiconductor materials (e.g., doped silicon), metals (e.g., tungsten, aluminum, titanium, or tantalum), conductive metal nitrides (e.g., titanium nitride, tantalum nitride, or tungsten nitride), or metal-semiconductor compounds (e.g., metal silicide). The lower conductive lines and the lower conductive patterns 124 may be formed of or include at least one of metals (e.g., copper, tungsten, or aluminum) or conductive metal nitrides (e.g., titanium nitride, tantalum nitride, or tungsten nitride).

A second lower interconnection structure may be formed in the lower interlayered insulating layer 120 and on the second region R2. For example, the second lower interconnection structure may include peripheral contact plugs 123 and lower interconnection lines 125. Each of the lower interconnection lines 125 may be electrically connected to the logic transistor TR2 via the peripheral contact plug 123 thereunder. The lower interconnection lines 125 may have top surfaces that are positioned at substantially the same height as those of the lower conductive patterns 124. In other words, the lower interlayered insulating layer 120, the lower conductive patterns 124, and the lower interconnection lines 125 may be formed to have coplanar top surfaces. The peripheral contact plugs 123 may be formed of the same material as the cell contact plugs 122, and the lower interconnection lines 125 may be formed of the same material as the lower conductive patterns 124. In some example embodiments, the contact plugs 122 and 123, the lower conductive patterns 124, and the lower interconnection lines 125 may be formed by a single or dual damascene process.

An etch stop layer 128 and a mold insulating layer 130 may be sequentially formed on the lower interlayered insulating layer 120. In some example embodiments, the mold insulating layer 130 may include the first and second mold insulating layers 132 and 134, which are sequentially stacked and have different refractive indices from each other. As an example, the first mold insulating layer 132 may be formed of or include silicon oxide, and the second mold insulating layer 134 may be formed of or include single-crystalline silicon, silicon nitride, or silicon oxynitride. The etch stop layer 128 may include a material having an etch selectivity with respect to the first mold insulating layer 132. For example, the etch stop layer 128 may include silicon nitride or silicon carbonitride.

The bottom electrode contacts BEC may be formed on the first region R1 to penetrate the mold insulating layer 130 and the etch stop layer 128 and to be connected to the lower conductive patterns 124. For example, the formation of the bottom electrode contacts BEC may include forming bottom electrode contact holes to penetrate the second mold insulating layer 134, the first mold insulating layer 132 and the etch stop layer 128 and expose the lower conductive patterns 124, and then, filling the bottom electrode contact holes with a conductive material. According to some example embodiments of the inventive concepts, the conductive material may include a monometallic material (e.g., tungsten).

Figure 11:
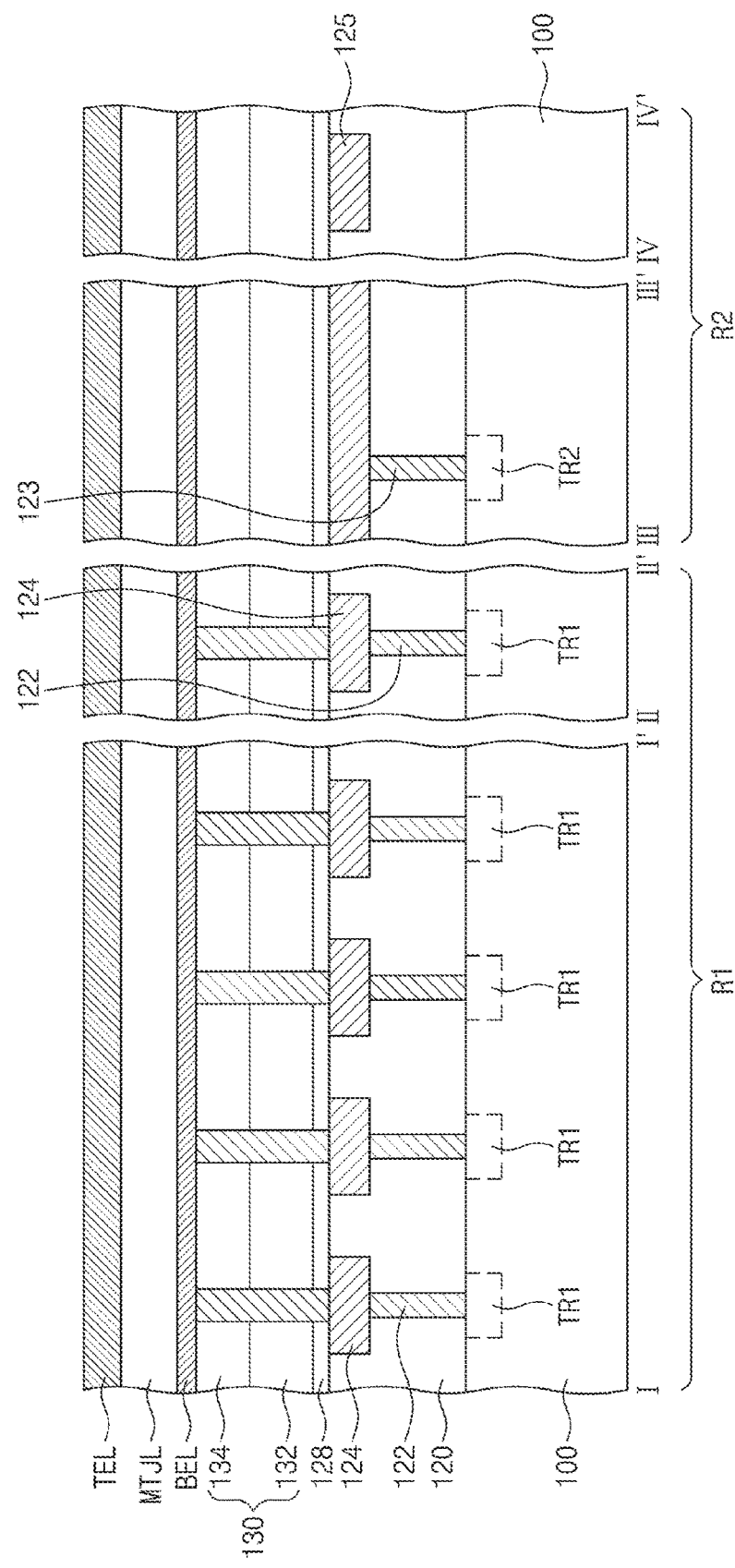

Referring to FIGS. 9 and 11, a bottom electrode layer BEL, a magnetic tunnel junction layer MTJL, a top electrode layer TEL may be sequentially formed on the substrate 100. The magnetic tunnel junction layer MTJL may include, for example, a pinned layer, a tunnel barrier layer, a free layer, which are sequentially stacked on the bottom electrode layer BEL. Each of the bottom electrode layer BEL, the pinned, tunnel barrier, and free layers of the magnetic tunnel junction layer MTJL, and the top electrode layer TEL may be formed of or include the same material as that of a corresponding one of the bottom electrode BE, the pinned layer PL, the tunnel barrier layer TBL, the free layer FL, and the top electrode TE that were described with reference to FIGS. 4 to 6. For example, the top electrode layer TEL may be formed of or include a conductive metal nitride (e.g., titanium nitride, tantalum nitride and/or tungsten nitride). The bottom electrode layer BEL, the magnetic tunnel junction layer MTJL, the top electrode layer TEL may be formed using a physical vapor deposition method or a chemical vapor deposition method.

Figure 12:
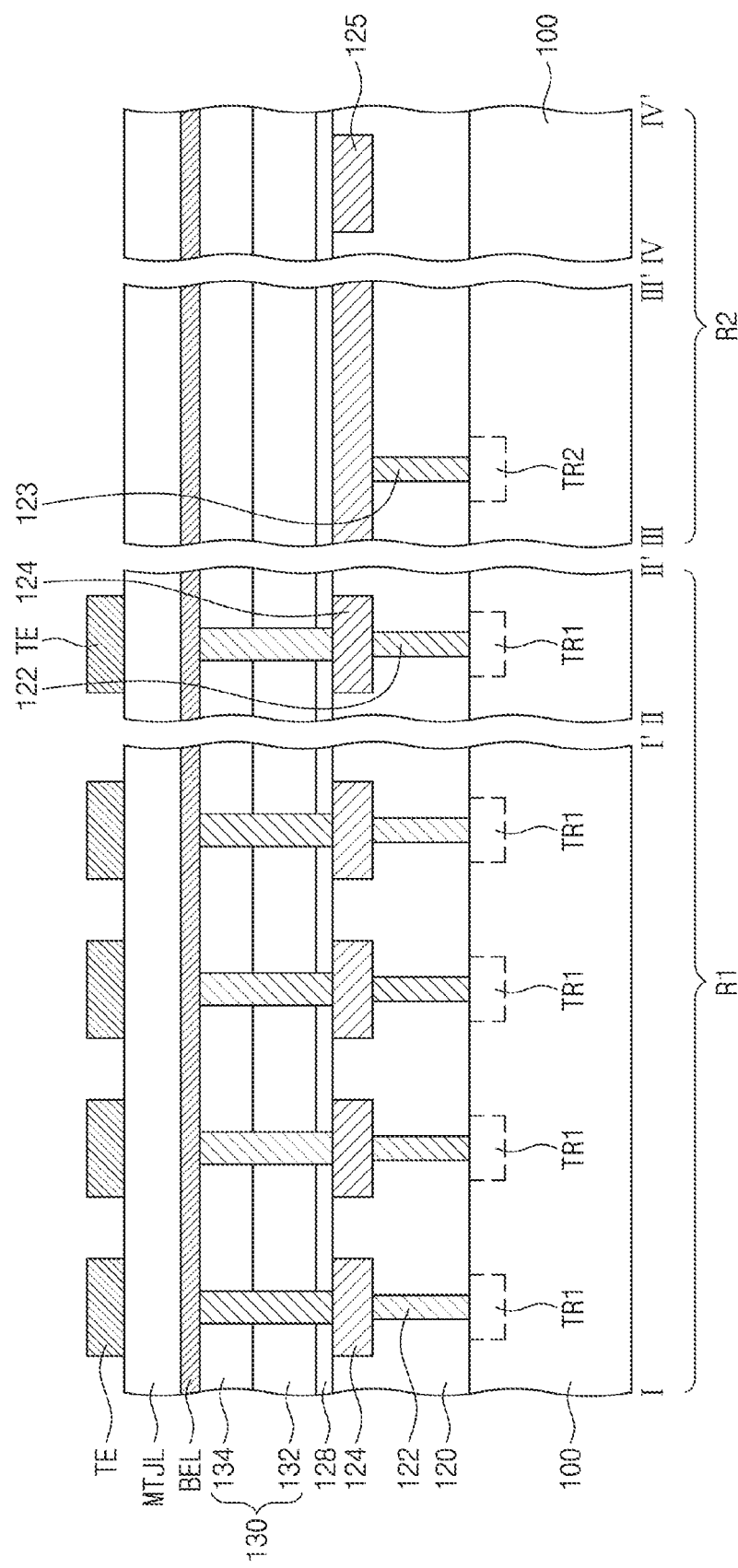

Referring to FIGS. 9 and 12, the top electrode layer TEL may be patterned to form the top electrode TE. For example, the formation of the top electrode TE may include forming a mask pattern (not shown) on the top electrode layer TEL and etching the top electrode layer TEL using the mask pattern as an etch mask. The etching of the top electrode layer TEL may be performed using a dry etching process, such as a plasma etching process or a reactive ion etching process. In some example embodiments, a plurality of the top electrodes TE may be arranged in the first and second directions D1 and D2 and on the first region R1, and each of them may be formed to have an island shape. During the formation of the top electrode TE, the top electrode layer TEL may be wholly removed from the second region R2.

Figure 13:
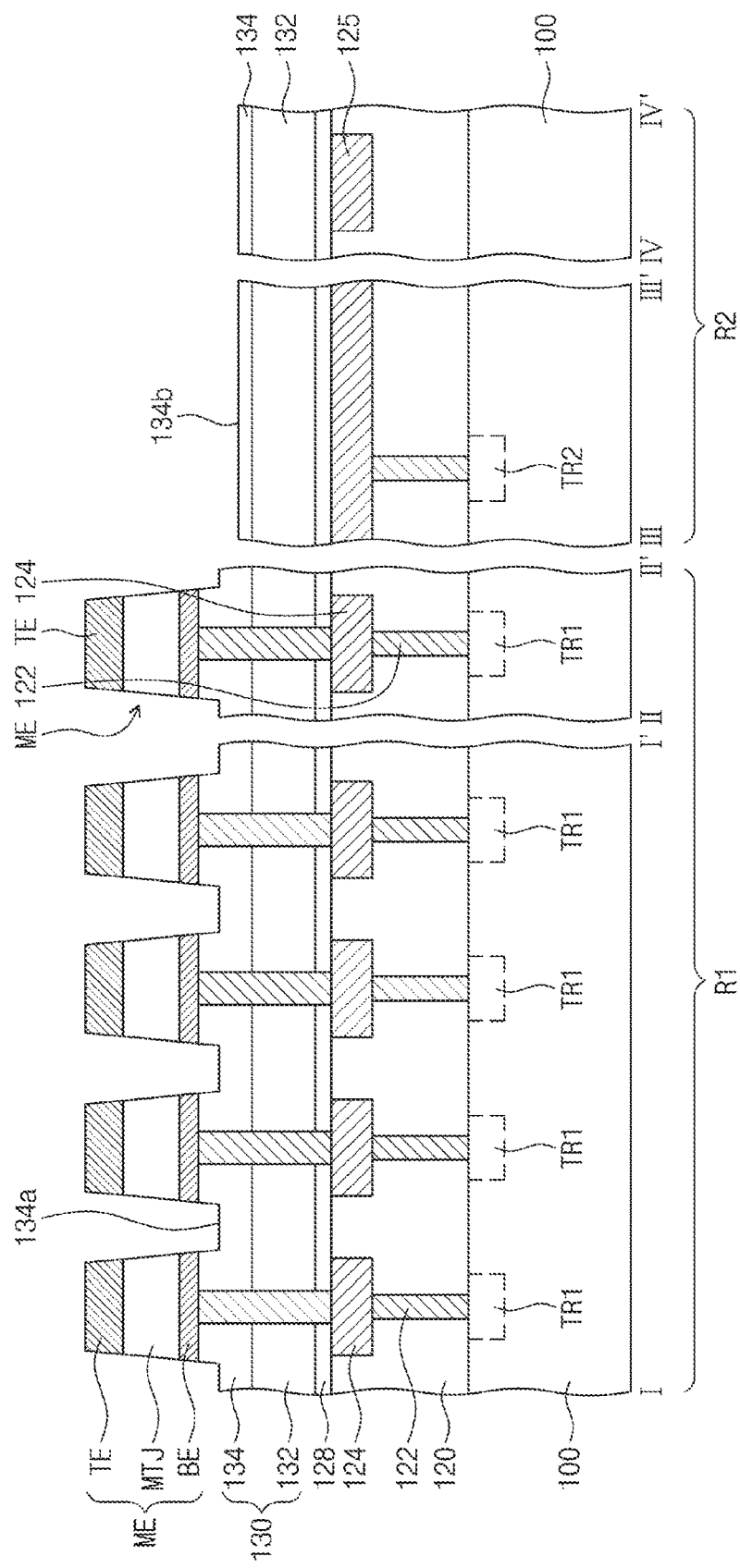

Referring to FIGS. 9 and 13, the memory elements ME may be formed on the bottom electrode contacts BEC by sequentially etching the magnetic tunnel junction layer MTJL and the bottom electrode layer BEL using the top electrode TE as a mask. Each of the memory elements ME may include the bottom electrode BE, the magnetic tunnel junction MTJ, and the top electrode TE sequentially stacked on the bottom electrode contact BEC. The etching of the magnetic tunnel junction layer MTJL and the bottom electrode layer BEL may be performed using, for example, an ion beam etching process. The ion beam etching process may be performed in such a way that an etch rate of the second mold insulating layer 134 containing an insulating material is higher than that of the magnetic tunnel junction layer MTJL containing a metallic material. Thus, between the magnetic tunnel junctions MTJ, a top surface of the second mold insulating layer 134 may be recessed during the formation of the memory elements ME. Owing to a difference in pattern density between the first and second regions R1 and R2, the recess depth of the top surface of the second mold insulating layer 134 may be greater on the second region R2 than on the first region R1. Restated, the recessed top surface of the second mold insulating layer 134 may have a greater height on the first region than on the second region. Accordingly, the second mold insulating layer 134 may be formed to have recessed top surfaces 134*a* and 134*b* whose levels are different from each other. The recessed top surface 134*b* of the second mold insulating layer 134 on the second region R2 may be lower than the recessed top surface 134*a* of the second mold insulating layer 134 on the first region R1. In some example embodiments, unlike that illustrated in the drawings, the second mold insulating layer 134 may be wholly removed from the second region R2.

Figure 14:
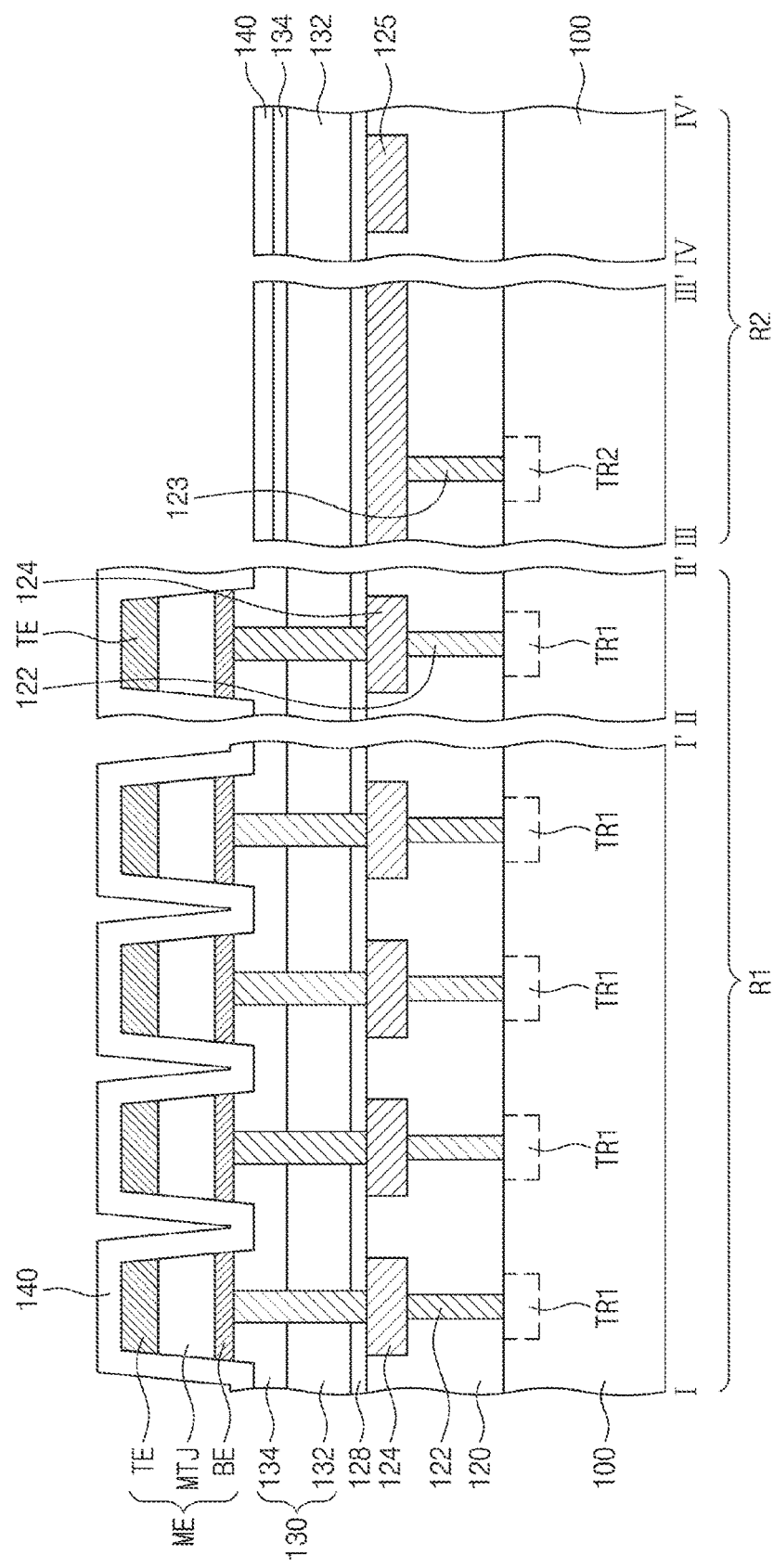

Referring to FIGS. 9 and 14, the capping insulating layer 140 may be formed on the mold insulating layer 130 to cover top and side surfaces of the memory elements ME. The capping insulating layer 140 may mitigate or prevent side surfaces of the magnetic tunnel junction MTJ from being oxidized in a subsequent process. In some example embodiments, the capping insulating layer 140 may be formed of or include silicon nitride. Although a height of the magnetic tunnel junction MTJ is exaggeratedly illustrated, a thickness of the capping insulating layer 140 may be greater than the height of the magnetic tunnel junction MTJ.

After the formation of the capping insulating layer 140, the semiconductor inspection system 500 of FIG. 1 may be used to measure perpendicular magnetization characteristics of the magnetic tunnel junction MTJ. If the measured perpendicular magnetization characteristics of the magnetic tunnel junction MTJ is within the allowed range, a subsequent process may be performed without an additional feedback step. If the measured perpendicular magnetization characteristics of the magnetic tunnel junction MTJ is not within the allowed range, an alert may be produced to provide feedback information for a previous step (e.g., for forming the magnetic tunnel junction layer MTJL) and to examine whether or not there is a process failure in the step.

Figure 15:
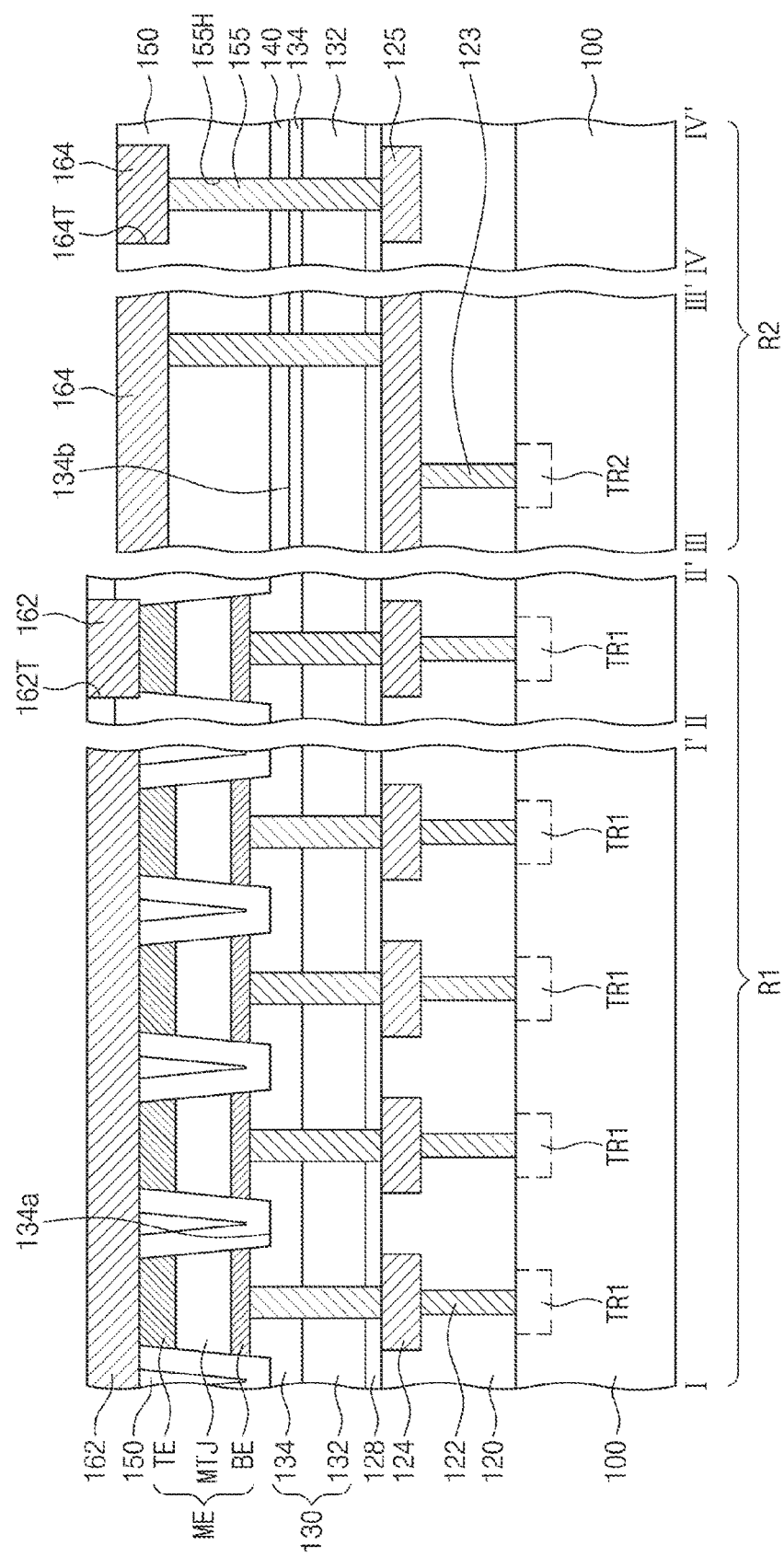

Referring to FIGS. 9 and 15, an insulating gapfill layer 150 may be formed on the substrate 100. The insulating gapfill layer 150 may be formed to fill gap regions between the memory elements ME and cover the top surfaces of the memory elements ME. Thereafter, a planarization process may be performed on a top surface of the insulating gapfill layer 150. Owing to the difference in height or level between the recessed top surfaces 134a and 134b of the second mold insulating layer 134, the top surface of the insulating gapfill layer 150 on the second region R2 may be lower than that on the first region R1. The etch stop layer 128, the mold insulating layer 130, the capping insulating layer 140, and the insulating gapfill layer 150 may constitute as an upper interlayered insulating layer.

A first trench 162T may be formed in the upper interlayered insulating layer and on the first region R1, and a peripheral via hole 155H and a second trench 164T may be formed in the upper interlayered insulating layer and on the second region R2. For example, on the first region R1, the first trench 162T may be formed to penetrate the insulating gapfill layer 150 and the capping insulating layer 140 and to expose top surfaces of a plurality of the memory elements ME arranged in the first direction D1. The second trench 164T may be formed in the insulating gapfill layer 150 and on the second region R2 and may have the same vertical depth as that of the first trench 162T. The peripheral via hole 155H may be extended downward from a bottom surface of the second trench 164T to expose a top surface of a lower interconnection line 125.

An upper conductive line 162 may be formed by filling a first trench 152T with a conductive material, and an upper interconnection line 164 and a peripheral via plug 155 may be formed by filling the second trench 164T and the peripheral via hole 155H with a conductive material. In some example embodiments, the upper conductive line 162, the upper interconnection line 164, and the peripheral via plug 155 may be formed of or include the same material (e.g., copper). As a result, the memory structure MS and the logic structure LS may be formed on the first region R1 and the second region R2, respectively. The peripheral via plug 155 may connect the lower interconnection line 125 to the upper interconnection line 164.

According to some example embodiments of the inventive concepts, during a fabrication process of a semiconductor device, magnetization characteristics of magnetic layers can be effectively monitored using a semiconductor inspection system. Thus, this method is more suitable for mass production, compared to the case that the magnetization characteristics of the magnetic layers are monitored during an assembly process or in an electrical die sorting (EDS) step performed using a probe. For example, it is possible to reduce time and cost for fabricating semiconductor devices with improved characteristics.

According to some example embodiments of the inventive concepts, a memory structure may be configured to improve measurement sensitivity of semiconductor inspection system which is used to measure perpendicular magnetization characteristics of magnetic layers. For example, elements, which are positioned on the magnetic layers, may be configured to increase effective transmittance of the memory structure to light (e.g., a laser beam). In addition, elements, which are provided below the magnetic layers, may be configured to increase effective reflectance of the memory structure to the light (e.g., the laser beam). This may make it possible to increase an amount of the laser beam reflected from the magnetic layers in the magnetic tunnel junction and consequently to improve the measurement sensitivity of the semiconductor inspection system.

As a result, during a fabrication process of a semiconductor device, perpendicular magnetization characteristics of magnetic layers can be effectively monitored using the semiconductor inspection system, and thus, it may be possible to provide a highly-stable semiconductor device that can be fabricated with high productivity.

While example embodiments of the inventive concepts have been particularly shown and described, it will be understood by one of ordinary skill in the art that variations in form and detail may be made therein without departing from the spirit and scope of the attached claims.

What is claimed is:

1. A device, comprising:
   a mold insulating layer on a substrate;
   a bottom electrode contact extending at least partially through the mold insulating layer;
   a magnetic tunnel junction on the bottom electrode contact; and
   a capping insulating layer covering side surfaces of the magnetic tunnel junction and a top surface of the mold insulating layer,
   wherein the mold insulating layer includes a first mold insulating layer and a second mold insulating layer,
   wherein the first mold insulating layer and the second mold insulating layer are sequentially stacked, in relation to each other, on the substrate,
   wherein the first mold insulating layer is associated with a first refractive index,
   wherein the second mold insulating layer is associated with a second refractive index, the second refractive index being different from the first refractive index,
   wherein the capping insulating layer includes a capping insulating layer material that is associated with a capping insulating layer refractive index that is greater than the first refractive index, and
   wherein the capping insulating layer having a thickness that is greater than a vertical height of the magnetic tunnel junction, the thickness of the capping insulating layer is a vertical thickness from the top surface of the mold insulating layer.

2. The device of claim 1, wherein,
   the vertical height of the magnetic tunnel junction is a particular value that ranges from about 150 Å to about 250 Å, and
   the thickness of the capping insulating layer is a separate value that ranges from about 500 Å to about 1000 Å.

3. The device of claim 1, wherein the second mold insulating layer includes a mold insulating layer material that is associated with a mold insulating layer refractive index that is greater than the first refractive index.

4. The device of claim 3, wherein,
   the first mold insulating layer includes silicon oxide, and
   the second mold insulating layer includes single-crystalline silicon, silicon nitride or silicon oxynitride.

5. The device of claim 1, wherein the bottom electrode contact includes a monometallic material.

6. The device of claim 1, wherein a center axis of the bottom electrode contact is aligned with a center axis of the magnetic tunnel junction in a direction that is normal to a top surface of the substrate.

7. The device of claim 1, further comprising:
   a top electrode on the magnetic tunnel junction,
   wherein the top electrode includes a conductive metal nitride.

8. A device, comprising:
   a substrate, the substrate including a first region and a second region;
   a first mold insulating layer and a second mold insulating layer sequentially stacked on the first and second regions of the substrate, the first mold insulating layer associated with a first refractive index, the second mold insulating layer associated with a second refractive index, the second refractive index being different from the first refractive index, the second mold insulating layer including a recessed top surface, the recessed top surface having a greater height on the first region than on the second region;

a bottom electrode contact extending vertically through an entirety of the first mold insulating layer and the second mold insulating layer on the first region;

a magnetic tunnel junction on the bottom electrode contact; and a capping insulating layer covering side surfaces of the magnetic tunnel junction and extending to a top surface of the second mold insulating layer, wherein the capping insulating layer having a thickness that is greater than a vertical height of the magnetic tunnel junction, the thickness of the capping insulating layer is a vertical thickness from the recessed top surface of the second mold insulating layer.

9. The device of claim 8, wherein the second mold insulating layer includes a mold insulating layer material that is associated with a mold insulating layer refractive index that is greater than the first refractive index.

10. The device of claim 8, wherein,
the vertical height of the magnetic tunnel junction is a particular value that ranges from about 150 Å to about 250 Å, and
the thickness of the capping insulating layer is a separate value that ranges from about 500 Å to about 1000 Å.

11. The device of claim 8, further comprising:
a top electrode on the magnetic tunnel junction,
wherein the bottom electrode contact includes a monometallic material, and
the top electrode includes a conductive metal nitride.

12. The device of claim 11, further comprising:
a lower interlayered insulating layer between the substrate and the first mold insulating layer;
a lower conductive pattern on the first region and in the lower interlayered insulating layer, the lower conductive pattern connected to the bottom electrode contact;
a lower interconnection line on the second region and in the lower interlayered insulating layer;
an upper conductive line coupled to the top electrode;
an upper interconnection line on the second region, the upper interconnection line having a top surface below a top surface of the upper conductive line; and
a via plug connecting the lower interconnection line to the upper interconnection line.

13. The device of claim 8, wherein a center axis of the bottom electrode contact is aligned with a center axis of the magnetic tunnel junction in a direction that is normal to a top surface of the substrate.

14. A device, comprising:
a bottom electrode contact on a substrate, the bottom electrode contact including a monometallic material;
a magnetic tunnel junction on the bottom electrode contact;
a top electrode on the magnetic tunnel junction, the top electrode including a conductive metal nitride;
a capping insulating layer covering side surfaces of the magnetic tunnel junction; and
a mold insulating layer, the bottom electrode contact extending at least partially through the mold insulating layer, the mold insulating layer includes a first mold insulating layer and a second mold insulating layer, the first mold insulating layer and the second mold insulating layer are sequentially stacked, in relation to each other, on the substrate, the first mold insulating layer is associated with a first refractive index, and the second mold insulating layer is associated with a second refractive index, the second refractive index being different from the first refractive index,
wherein the capping insulating layer includes a capping insulating layer material that is associated with a capping insulating layer refractive index that is greater than the first refractive index, and
wherein the capping insulating layer having a thickness that is greater than a vertical height of the magnetic tunnel junction, the thickness of the capping insulating layer is a vertical thickness from a top surface of the second mold insulating layer.

15. The device of claim 14, wherein,
the vertical height of the magnetic tunnel junction is a particular value that ranges from about 150 Å to about 250 Å, and
the thickness of the capping insulating layer is a separate value that ranges from about 500 Å to about 1000 Å.

16. The device of claim 14, wherein the second mold insulating layer includes a mold insulating layer material that is associated with a mold insulating layer refractive index that is greater than the first refractive index.

17. The device of claim 14, wherein a center axis of the bottom electrode contact is aligned with a center axis of the magnetic tunnel junction in a direction that is normal to a top surface of the substrate.

* * * * *